(12) United States Patent
Ouyang et al.

(10) Patent No.: US 9,646,900 B2
(45) Date of Patent: May 9, 2017

(54) PROGRAMMABLE ADDRESSABLE TEST CHIP (71) Applicant: Semitronix Corporation, Hangzhou (CN)

(72) Inventors: Xu Ouyang, Hangzhou (CN); Yongjun Zheng, Hangzhou (CN); Zheng Shi, Hangzhou (CN); Peiyong Zhang, Hangzhou (CN)

(73) Assignee: Semitronix Corporation, Hangzhou (CN)

( * ) Notice: Subject to any disclaimer, the term of this patent is extended or adjusted under 35 U.S.C. 154(b) by 52 days.

(21) Appl. No.: 14/604,705

(22) Filed: Jan. 24, 2015

(65) Prior Publication Data

US 2015/0212144 A1   Jul. 30, 2015

(30) Foreign Application Priority Data

Jan. 26, 2014   (CN) .......................... 2014 1 0038718

(51) Int. Cl.
*H01L 21/66* (2006.01)
*G01R 31/28* (2006.01)

(52) U.S. Cl.
CPC .......... *H01L 22/32* (2013.01); *G01R 31/2884* (2013.01); *H01L 22/14* (2013.01); *H01L 22/34* (2013.01)

(58) Field of Classification Search
CPC ..... G01R 31/2884; H01L 22/32; H01L 22/14; H01L 22/34
See application file for complete search history.

(56) References Cited

U.S. PATENT DOCUMENTS

| | | | | | |
|---|---|---|---|---|---|
| 5,059,899 | A | * | 10/1991 | Farnworth | G01R 31/2884 257/48 |
| 5,498,886 | A | * | 3/1996 | Hsu | G06F 11/2051 257/213 |
| 5,508,631 | A | * | 4/1996 | Manku | G06F 11/2733 324/750.3 |
| 7,494,829 | B2 | * | 2/2009 | Subramaniam | G01R 31/2894 324/762.1 |
| 7,851,235 | B2 | * | 12/2010 | Hong | H01L 22/14 257/48 |
| 7,859,285 | B2 | * | 12/2010 | Sheu | G01R 31/2831 324/750.3 |
| 2005/0085032 | A1 | * | 4/2005 | Aghababazadeh | G01R 31/2831 438/232 |

* cited by examiner

*Primary Examiner* — Julian Huffman
*Assistant Examiner* — Michael Konczal
(74) *Attorney, Agent, or Firm* — Syncoda LLC; Feng Ma; Junjie Feng (57) ABSTRACT A programmable test chip includes a target chip to be tested and addressing circuits fabricated on the same wafer. The addressing circuits can be placed in the scribe lines or a pre-allocated area of the wafer. When testing the target chip, a circuit connecting the target chip and the addressing circuits can be fabricated on demand. In some cases the target chip is not connected to the addressing circuits, and a DUT array exists in a scribe line having a connecting circuit prefabricated between the addressing circuits with the DUT array for testing the DUT array in the scribe line. When the need for testing the target chip arises, the prefabricated connecting circuit can be cut, and the connecting circuit connecting the target chip and the addressing circuits can be fabricated. Based on results from such test chips, the manufacturing process can be better studied.

18 Claims, 8 Drawing Sheets

FIG. 8

PROGRAMMABLE ADDRESSABLE TEST CHIP

CROSS-REFERENCE TO RELATED APPLICATIONS

The present application is a continuation of, and claims priority to, Chinese Patent Application No. CN 201410038718.X filed on Jan. 26, 2014, the disclosure of which is hereby incorporated by reference in its entirety.

BACKGROUND

With the advances in microelectronic technologies, integrated circuits have come to the nanometer era. The feature sizes of the microelectronic devices are getting smaller, and the chip scale is getting larger with millions or even billions of transistors being placed on a single chip. Semiconductor manufacturing process has evolved into 28-nm node or even beyond; when the minimum line width of the chip layout is getting yet smaller and the scale of chip is getting larger, the layout design also becomes more complicated. Even when using the mainstream 193 nm lithographic process, the system-on-a-chip designed in accordance with the design rules may still suffer a low yield of finished products. Therefore, it is important to quantify the influential factors so as to improve the product yield.

SUMMARY

A test chip can be used to evaluate the yield of finished product chips. The test chip may have limitations on the testing circuit positions, the area utilization of the chip, the number of the testing components, and the testing time. During the manufacturing, the fabrication of masks can have a significant cost. The present disclosure provides a test method using programmable addressable test chip, which allows the target chip to be quickly and conveniently tested and the manufacturing processes to be better studied.

The present disclosure provides a programmable addressable test chip that can reduce the fabrication cost of masks, increase the number of devices under test, and improve test speed.

Technological approaches related to the programmable addressable test chip are described below.

In the programmable addressable test chip according to some embodiments, the test chip can include two portions fabricated on the same wafer. For example, a target chip to be tested, and addressing circuits that can be placed in the scribe lines or other pre-allocated area or an empty area of the wafer. The target chip and the addressing circuits are configured to be connected by a connecting circuit fabricated on demand. When testing the target chip, a circuit connecting the target chip and the addressing circuits can be fabricated; when the target chip does not need to be tested, the connecting circuit is not necessary and is not made.

In some cases, if a DUT (Device Under Test) array exists in a scribe line of the programmable addressable test chip, the test chip can include three portions fabricated on the same wafer: the target chip to be tested, the addressing circuits disposed in the scribe lines or other pre-allocated area or an empty area of the wafer, and the DUT array. A connecting circuit can be prefabricated and used for connecting the addressing circuits with the DUT array and testing of the DUT array in the scribe line. When a need for testing the target chip arises, the connecting circuit between the DUT array and the addressing circuits can be cut or not prefabricated, and the connecting circuit connecting the target chip and the addressing circuits is fabricated. The prefabricated connection between the addressing circuits and the DUT array can be used to measure the characteristics of DUTs and to find out the problems of DUTs based on the measurement data, so as to monitor the manufacturing process.

The addressing circuits can be fabricated with the target chip purposefully. However, during the fabrication of the chip, some components and pads can also be fabricated in the scribe lines or other pre-allocated area or an empty area of a wafer for some special purposes. These components and pads can also be used to form addressing circuits.

In some embodiments, the connecting circuit includes one or more conductor wires fabricated using single-metal-layer or multi-metal-layer through lithography.

In some embodiments, the connecting circuit includes one or more conductor wires fabricated using single-poly-layer or multi-poly-layer through lithography.

In some embodiments, the connecting circuit includes one or more conductor wires fabricated using single-package-layer or multi-package-layer through lithography.

In some embodiments, the shape of the connection between the target chip to be tested and the addressing circuits is realized through direct electron beam writing.

In some embodiments, the connection between the target chip to be tested and the addressing circuits is realized through usage of focused ion beam technology for metal deposition.

In some embodiments, the connection between the DUT array and the addressing circuits is cut open by focused ion beam.

Whether to disconnect or to connect the target chip to be tested and the addressing circuits can be determined by the characteristics and the yield of product chips.

The DUT in the present disclosure can include two types: device to be tested of the target chip and the device to be tested of the DUT array.

In some embodiments, the DUTs can be transistors having threshold voltages and leakage currents under a saturation condition or a linear operating condition, which can be measured by the addressing circuits. Whether two transistors match each other can be determined through a comparison between the threshold voltages of the two transistors. Whether there are any issues in the fabrication of the electrodes of transistors can be determined through the corresponding leakage current data.

In some embodiments, the DUT can be ring oscillators, of which working frequencies, dynamic currents, and quiescent currents can be measured by the addressing circuits. Based on the measured frequency data, the delay of the inverter or logic gate in the ring oscillator can be determined; based on the correlation of dynamic currents and the quiescent currents with the frequency data, the dynamic power consumption and the quiescent power consumption of the inverter or logic gate in the ring oscillator can be determined. As such, the characteristics of the ring oscillators can be determined, and the manufacturing processes can be studied.

In some embodiments, one or more sections of a conductor of the target chip can be connected with the addressing circuits to test the resistance of the conductor.

In some embodiments, one or more wires of the target chip can be tested by connecting them to the addressing circuits. Whether the wires have problems of short circuits or broken circuits can become apparent.

In another aspect, the present disclosure provides a method of fabricating a programmable addressable test chip.

The method can include: providing a target chip to be tested; providing an addressing circuit placed in a scribe line, a pre-allocated area, or am empty area of a wafer; fabricating a connecting circuit connecting the target chip and the addressing circuits on demand. If a DUT array exists in a scribe line, a connecting circuit can be already present connecting the DUT array and the addressing circuits, the method can then include cutting the connecting circuit upon a need arises for testing the target chip and fabricating a connecting circuit connecting the target chip and the addressing circuits. Whether to fabricate a connecting circuit connecting the target chip and the addressing circuits can be determined by properties and the yield of the product chips.

The addressing circuits disclosed herein can be pre-disposed and pre-fabricated on one wafer, and these addressing circuits can generate address selecting signals and route measuring signals to and from DUTs on the target chip without the need of external instruments, so as to provide addressability and testability upon the DUT on target chip. Compared with testing the chips directly using pads, embodiments disclosed herein allow more devices on the target chip to be connected and tested through limited number of pads. Compared with the method of designing and fabricating target chips and addressing circuits specifically for testing purpose, embodiments disclosed herein allow the target chip, the addressing circuits, and the DUT array to be fabricated on the same wafer, while the connections between them are configured to program the respective functionalities and simplify the fabrication processes. In addition, shorter testing time and higher testing speed can be achieved. Furthermore, placing the addressing circuits in the scribe lines or pre-allocated area of a wafer allows the chip to have higher utilization ratio. The DUT array in the scribe lines of the target chip and the addressing circuits can be directly connected; therefore, the typical addressable DUT testing for manufacturing process monitoring can be accommodated more advantageously with embodiments disclosed herein.

DETAILED DESCRIPTION

During the fabrication process of semiconductors, the defect rate and the yield can be obtained from short-flow test chips and addressable test chips. The test chips can be divided into two types based on their positions on the wafer: the independent test chip and the test chip placed in the scribe lines. The independent test chip is large and needs to occupy the space of a chip die, and semiconductor manufacturers would have to bear the cost of the fabrication of the masks. On the other hand, scribe lines are the space reserved for cutting the chips. Placing the test chip in the scribe lines can improve the utilization ratio of the space of the wafer. In conventional addressable test chips, where the target chip and the addressing circuits are designed and fabricated specifically for testing purpose, the target chip is placed into the addressing circuits, and the target chip and the addressing circuits are connected for further testing.

Figure 1:
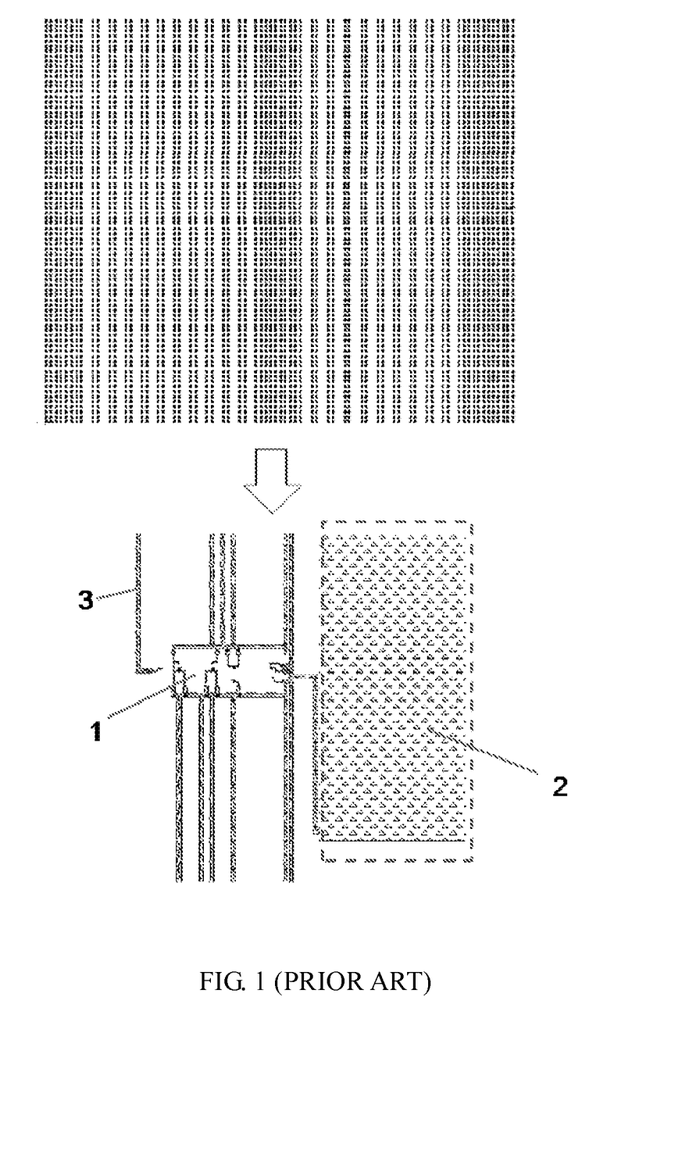
FIG. 1 illustrates a conventional test method for testing the target chip by adding pads, or one or more contact layers.
Figure 2:
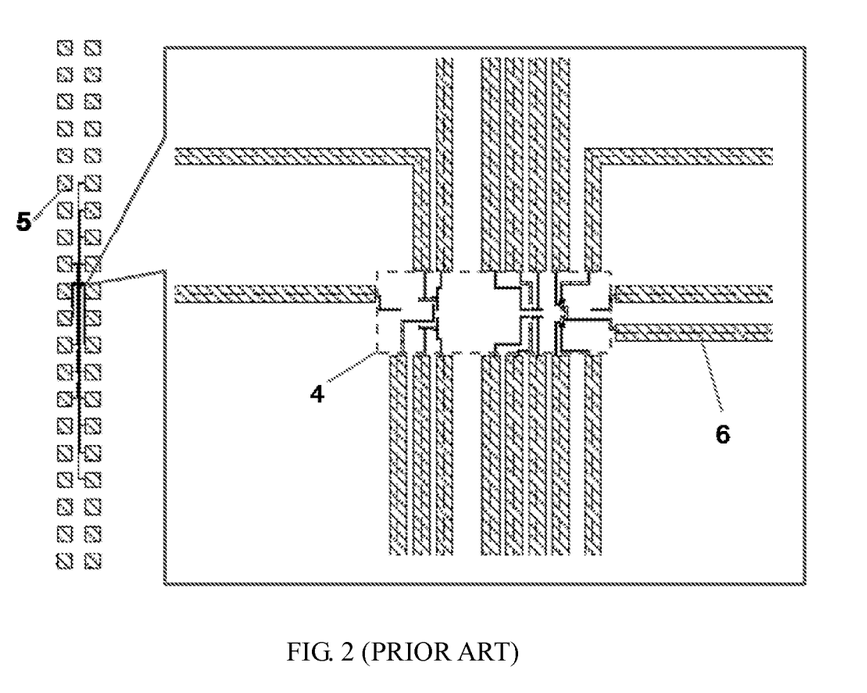
FIG. 2 illustrates a conventional test method for testing the target chip by adding one or more contact layers to the given pads array.

Another test method can include: selecting representative transistors of the target chip, adding pads and contact layers to facilitate the selected transistors being route-connected and tested. As shown in FIG. 1, numeral reference 1 represents the selected transistors, numeral reference 2 represents the added pads, and numeral reference 3 represents the contact layer. In some cases, the pad array is prefabricated by the chip manufacturer. The DUTs can be placed near the pads, and the DUTs and the pads can be connected through the metal wires. As shown in FIG. 2, numeral reference 4 represents the selected transistors, numeral reference 5 represents the added pads, and numeral reference 6 represents the metal-line contact layer. In this test method, the testing units are connected to the pads, and each testing structure has its corresponding pads. The testing structures can share the pads; however, the pads still occupy some space, and there are also limits on the number of devices to be tested. As a result, the testing can take a lot of time.

During the fabrication processes of semiconductors, various approaches can be employed to make the connections, for example: (1) adding the metal or silicon layer(s) and making the connecting lines through lithography; (2) direct writing of electron beam, such as using the electron beam to draw or project patterns directly on the wafer coated with photoresist, and then fabricating the connecting lines through lithography; (3) exposure technology with focused ion beam, such as using the ion beam to draw or cut patterns directly on the wafer to generate the desired connecting lines.

Figure 3:
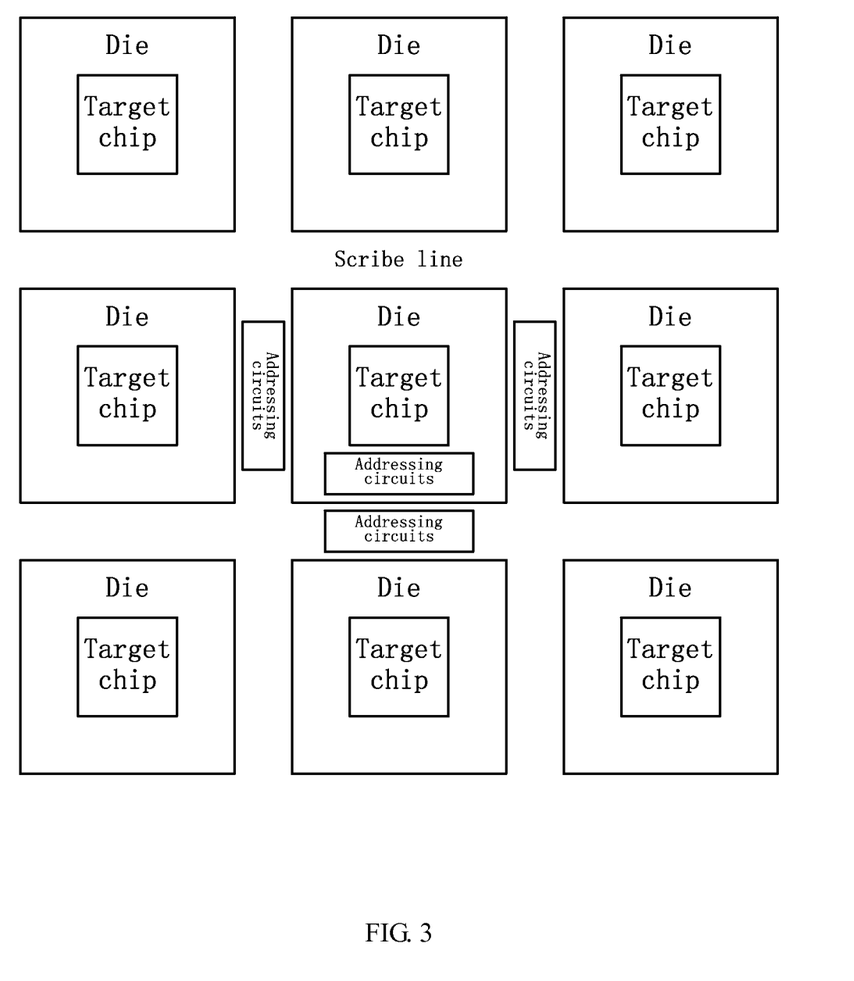
FIG. 3 is a schematic diagram of the placement of addressing circuits according to some embodiments.
Figure 4:
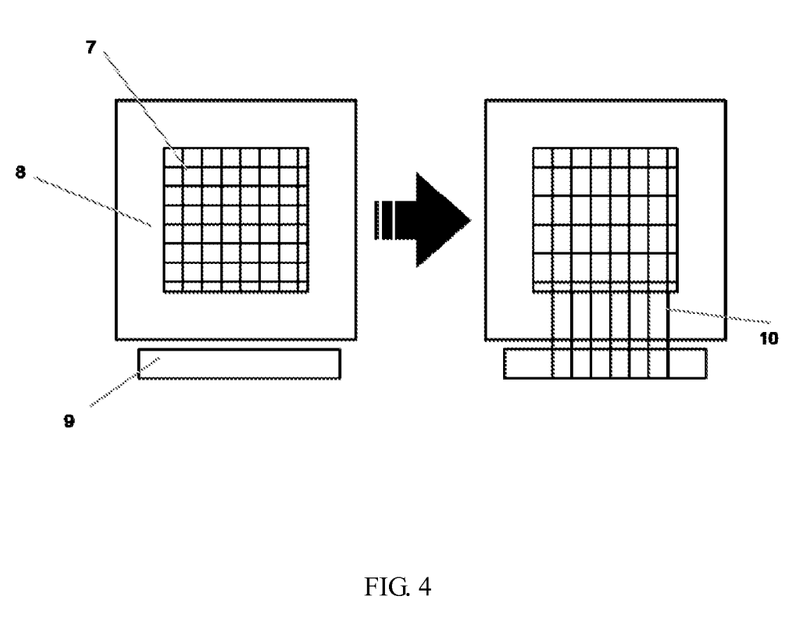
FIG. 4 is a schematic diagram of some embodiments.
Figure 6:
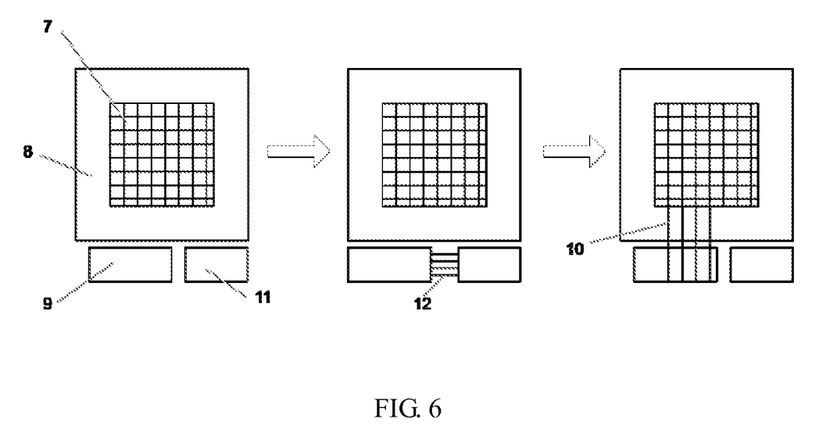
FIG. 6 is another schematic diagram according to some embodiments.

At least some of the embodiments disclosed herein can overcome shortcomings in other technologies, such as the limits of the positions of the test chip, the low utilization ratio of space, the limits on the number of components to be tested, the long testing time, and the high cost of masks. Some embodiments disclosed herein provide a test method using programmable addressable test chip, as shown in FIGS. 4 and 6, wherein numeral reference 7 represents the target chip, numeral reference 8 represents the chip die, and the target chip is fabricated on the die. Numeral reference 9 represents the addressing circuits, numeral reference 10 represents the connecting circuits connecting the target chip and the addressing circuits, numeral reference 11 represents the DUT array, and numeral reference 12 represents the connecting wires to connect the DUT array and the addressing circuits. The test chip in this method can be placed in the scribe lines or on other pre-allocated areas of the wafer, as shown in FIG. 3. FIG. 3 illustrates a portion of a wafer, where the scribe lines are the unoccupied spaces between the chip dies. In this method, the extra pads as in FIG. 1 do not need to be added, thereby the addressing circuits improve the area utilization ratio. The target chip and the addressing circuits can be designed and fabricated together and placed on the same wafer. The approaches disclosed herein can greatly reduce the number of masks. The test chip has no limits on the number of the target chips, and there is no need for the probe contacting time, thereby improving the testing speed and reducing the testing time. Using the same design of addressing circuits to measure the DUT array and the target chip directly can also ensure the accuracy of the tests.

More detailed explanations on various embodiments will be given below with reference to the drawings. Transistors of the target chip can be used as the DUTs, and the addressing circuits can be placed in the scribe lines in the explanations.

Embodiment 1

In the embodiment shown in FIG. 4, the test chip includes two portions that can be fabricated on a same wafer, namely the target chip to be tested, and the addressing circuits placed in the scribe lines of the wafer. If the target chip does not need to be tested, there is no need to fabricate the connecting circuit between the target chip and the addressing circuits, as shown in the left portion of FIG. 4. When the target chip needs to be tested, the connecting circuit between the target chip and the addressing circuits can be fabricated to realize the connection between the target chip and the addressing circuits, as shown in the right portion of FIG. 4.

Figure 5:
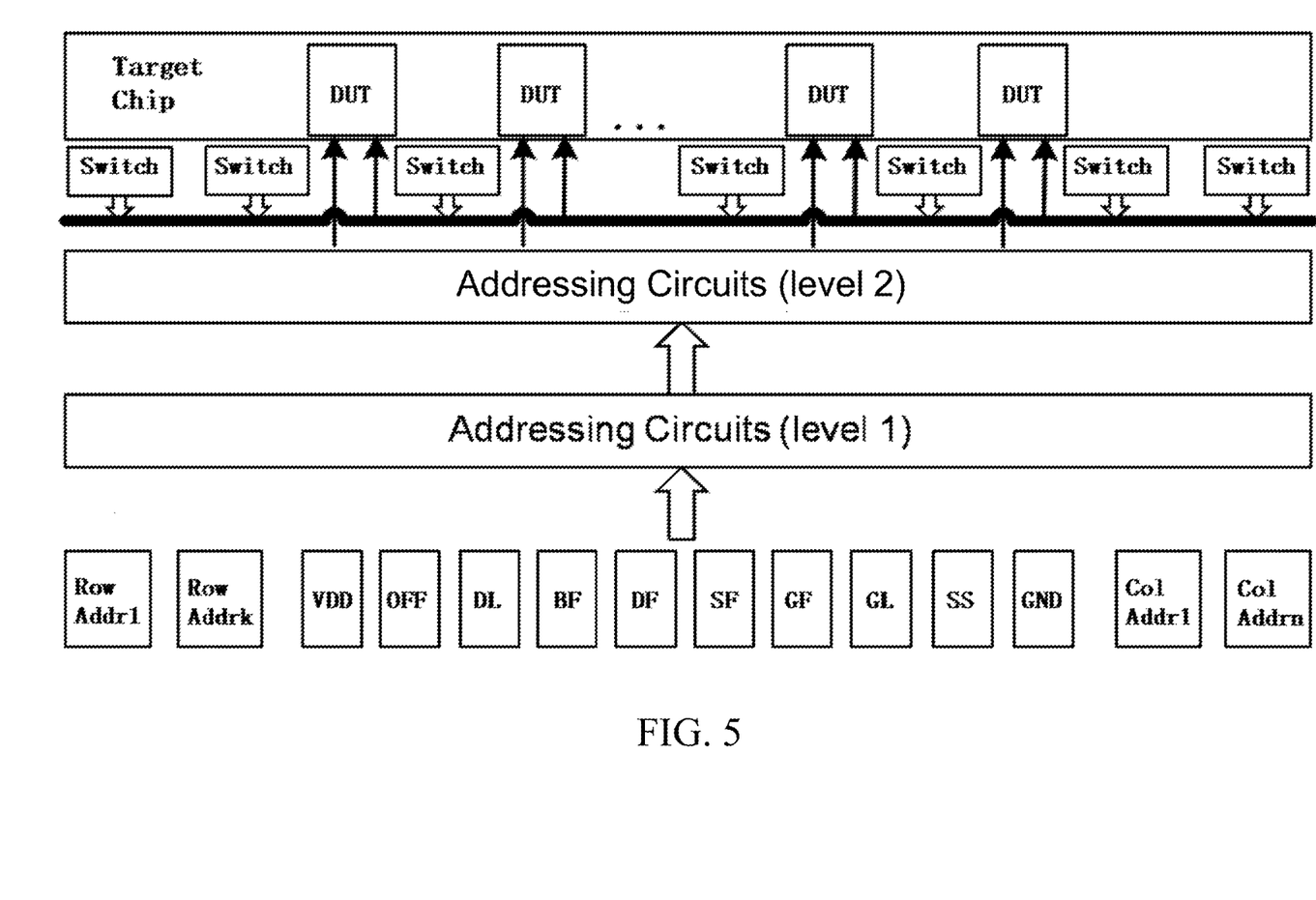
FIG. 5 is a circuit structure schematic diagram of the target chip and addressing circuits according to some embodiments.

This embodiment takes the transistors in the target chip as the DUTs, as shown in FIG. 5. The circuit configuration can include a transistor having four ports: D, G, S, and B, and pads SF, SS, GF, GL, DF, DL, and BF will be connected to the four ports correspondingly. DF applies the signal to the D port of the DUT; GF applies the signal to the G port of the DUT; SF applies the signal to the S port of the DUT; BF applies the signal to the B port of the DUT; SS is to test the voltage drop from the SF to the S port of the DUT; DL is to test the voltage drop from the DF to the D port of the DUT; the function of SS and DL signals is to make up for the accuracy loss brought by the voltage drop; GL is to increase the voltage of the G ports of GUTs that are not selected and its function is to minimize the influence from the DUTs that are not selected during testing. The addressing circuits can also include a switching circuit. The addressing circuits can produce the addressing signals after the ROW addr1-k and COL addr1-n are input with the row signals and column signals. The addressing signals are output to the switching circuit to control switches' on/off states; one address selects one corresponding DUT, while other switches in the circuit are off and the corresponding DUTs are not selected. In this way, the addressing signals and the switching signals allow the addressing circuits to orderly work and test target DUTs. Each address is used to generate the corresponding addressing signals and choose a corresponding DUT; therefore, the address range of the addressing circuits is directly proportional to the number of DUTs. The exact number of the addresses can be determined by the users.

The leakage current of a transistor under the saturation condition or linear operating condition can be measured by the addressing circuits. Whether the two transistors match with each other can be determined through the comparison between the threshold voltages of the two transistors, and whether there are any problems of the fabrication of the electrodes of transistors can be determined through the corresponding leakage current data. The leakage current of the two transistors fabricated together should be the same in principle. If the two currents have a relatively large difference, the two transistors have mismatches, and this possibly means there are some problems in the process of fabrication, subsequently the user can find the problems by analyzing data.

The addressing circuits, according to some embodiments, can be placed on a pre-allocated area of the wafer unoccupied by other functional components.

The target chip and the addressing circuits fabricated on the same wafer can greatly simplify the manufacturing processes and reduce the cost of fabricating the test chip. For example, the target chip may need 10 masks, and the addressing circuits may need 8 masks. However, when the target chip and the addressing circuits are fabricated together, only 10 masks are needed.

In some embodiments, the connecting circuits are fabricated using a metal layer through lithography. In some embodiments, the connecting circuits can be fabricated using several metal layers through lithography on demand; and in some embodiments, the connecting circuits can be fabricated using one or several poly-silicon layers through lithography on demand; and in some other embodiments, the connecting circuits can be fabricated using one or several package layers through lithography on demand As such, the addressable test chip is "programmable" in that it can be programmed to have desired connecting circuits based on the needs.

During the fabrication of the chip, for some special needs, in the scribe lines or other pre-allocated areas of a wafer there may be some components and pads or other circuits. In some situations, these components, pads and circuits can be used to form the addressing circuits.

After the connection between the target chip and the addressing circuits has been completed, the target chip can be tested and analyzed.

The target chip can be a chip manufactured by semiconductor manufacturer. Whether to disconnect or connect the target chip to be tested and the addressing circuits shall be mainly determined by the characteristics and the yield of the product chips. If the characteristics and yield of the finished products are normal and the user does not need other tests, it is not necessary to fabricate connecting circuits to connect the target chip and the addressing circuits and to test the target chip. If the characteristics and yield of the finished products are abnormal such that the further tests and analysis are necessary, then one or more chips can be selected from the products on the wafer as the target chips to be tested and subsequently they can be connected to the addressing circuits for further testing.

Embodiment 2

As shown in FIG. 6, the test chip can include three portions fabricated on the same wafer, namely the target chip to be tested, the addressing circuits placed in the scribe lines of the wafer, and the DUT array. The addressing circuits and the DUT array can be already connected. As shown in FIG. 6, the left portion is the schematic diagram of the target chip, the addressing circuits, and the DUT array that can be fabricated on the same wafer. The center portion is the schematic diagram of the connection of the addressing circuits and the DUT array. The right side portion is the schematic diagram of the connection of the target chip and the addressing circuits. When a need for testing the target chip arises, the connecting circuit between the DUT array and the addressing circuit can be cut open, and the connecting circuit connecting the target chip and the addressing circuit is fabricated on demand.

Figure 7:
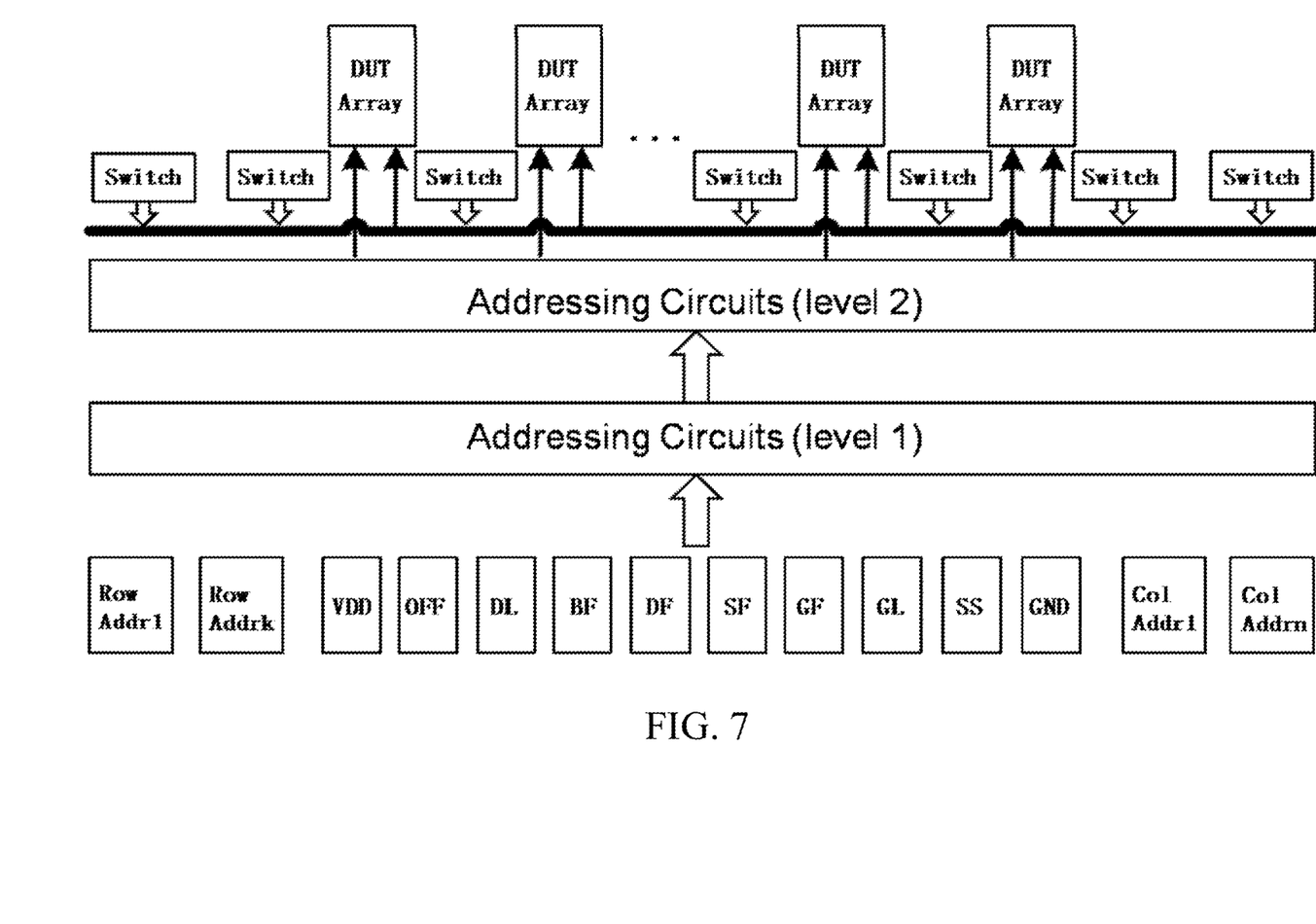
FIG. 7 is a circuit structure schematic diagram of the DUT array and the addressing circuits.

The circuit configuration of the connection of the addressing circuits and the DUT array is shown in FIG. 7. The working principle can be similar to that illustrated in FIG. 5. After power is supplied, the addressing signals and switching signals will allow the addressing circuits to select a DUT from the DUT array to be tested. Each address is used to generate corresponding addressing signals and select a corresponding DUT in the DUT array; therefore, the address range of the addressing circuits can be directly proportional to the number of DUTs. The exact number of the addresses can be be determined by the users by their demands. When the target chip needs to be tested, the connection between the addressing circuits and the DUT array can be cut open and the connecting circuit between the DUT of the target chip and the addressing circuits can be fabricated. In this embodiment, transistors are used as the DUTs in the target chip, and its circuit configuration is similar to that illustrated in FIG. 5.

The leakage current of a transistor under the saturation condition or line operating condition can be measured by the addressing circuits. Whether the two transistors match with each other can be determined through the comparison between the threshold voltages of the two transistors, and whether there are any problems of the fabrication of the electrodes of transistors can be determined through the corresponding leakage current data. In a similar way, the problems of the fabrication of the DUT array can also be obtained through the addressing circuits' test on DUT array.

The addressing circuits, according to some embodiments, can be placed on a pre-allocated area of the wafer unoccupied by other functional components.

Fabricating the target chip to be tested, the addressing circuits, and DUT array on the same wafer can greatly simplify the manufacturing processes and reduce the cost of fabricating the test chip. For example, the target chip may need 10 masks, the addressing circuits may need 8 masks, and the DUT array may need 5 masks. However, when the target chip, the addressing circuits, and the DUT array are fabricated together, only 10 masks are needed according to some embodiments.

In some embodiments, the connecting circuits are fabricated using a metal layer through lithography. In some embodiments, the connecting circuits can be fabricated using several metal layers through lithography on demand; and in some embodiments, the connecting circuits can be fabricated using one or several poly-silicon layers through lithography on demand; and in some other embodiments, the connecting circuits can be fabricated by one or several package layers through lithography on demand.

During the fabrication of the chip, for some special needs, in the scribe lines or other pre-allocated area of a wafer there may be some components and pads or other circuits. In some situations, these components, pads and circuits can be used to form the addressing circuits.

Whether to disconnect or connect the target chip to be tested and the addressing circuits can be determined by the characteristics and the yield of the product chips.

After the connection between the target chip to be tested and the addressing circuits has been completed, the target chip can be tested and analyzed.

Figure 8:
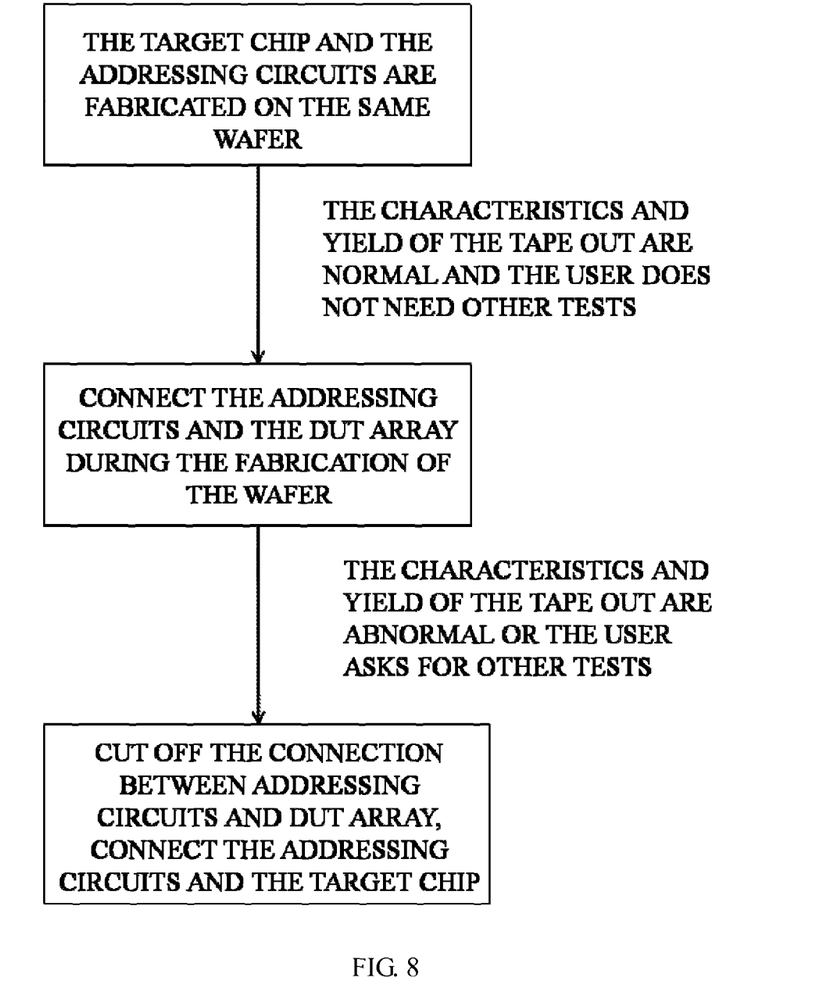
FIG. 8 is a flow diagram of determining whether to connect the target chip with the addressing circuits.

The target chip can be a chip manufactured by a semiconductor manufacturer. As shown in FIG. 8, if the characteristics and yield of the product chips are normal, and the user does not need other tests, then the connection between the addressing circuits and the DUT array can be maintained and no connecting circuit will be fabricated to connect the target chip and the addressing circuits. If the characteristics and yield are abnormal, or the user asks for other tests, then the connection between the addressing circuits and the DUT array can be cut open and the connecting circuits between the target chip and the addressing circuits can be fabricated to connect the two.

The connection of the addressing circuits and the DUT array can be used to measure properties of the DUT in the DUT array, and to monitor the processes through the corresponding data.

Embodiment 3

The difference between this embodiment and Embodiments 1 and 2 is that Embodiments 1 and 2 have a connecting circuit and the connecting wires are fabricated through lithography. In Embodiment 3, the connection between the target chip and the addressing circuits is fabricated through the method of direct writing of electron beam.

Embodiment 4

The difference between this embodiment and Embodiments 1 and 2 is that Embodiments 1 and 2 have a connecting circuit and the connecting wires are fabricated through lithography. In Embodiment 4, the connection between the target chip to be tested and the addressing circuits is fabricated through the method of focused ion beam technology to guide metal deposition.

Embodiment 5

This embodiment is developed based on Embodiment 2: the connection between the DUT array and the addressing circuits is cut open by a focused ion beam.

Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A programmable addressable test chip comprising:
    a target chip to be tested; and
    addressing circuits disposed in scribe lines of a wafer reserved for cutting a plurality of target chips from the wafer;
    wherein the target chip and the addressing circuits are configured to be connected by a connecting circuit fabricated on demand;
    the programmable addressable test chip further comprising:
    a device under test (DUT) array predisposed in the scribe lines;
    wherein the DUT array is configured to have a connection with the addressing circuits cut upon a need arises for testing the target chip and the fabrication of the connecting circuit for the target chip and the addressing circuits.

2. The programmable addressable test chip of claim 1, wherein the connection between the DUT array and the addressing circuits is configured to be cut open on demand using a focused ion beam.

3. The programmable addressable test chip of claim 1, further comprising components and pads in the scribe lines of the wafer.

4. The programmable addressable test chip of claim 1, wherein the connecting circuit comprises one or more conductor wires fabricated using at least one of: a single metal layer, multiple metal layers, a single poly-silicon layer, multiple poly-silicon layers, a single package layer, or multiple package layers, through lithography.

5. The programmable addressable test chip of claim 1, wherein the connecting circuit between the target chip to be tested and the addressing circuits is fabricated on demand with direct electron beam writing.

6. The programmable addressable test chip of claim 1, wherein the connecting circuit between the target chip to be tested and the addressing circuits is fabricated on demand using a focused ion beam for metal deposition.

7. The programmable addressable test chip of claim 1, wherein: whether to disconnect or connect the target chip to be tested and the addressing circuit is determined by characteristics and yield of product chips.

8. The programmable addressable test chip of claim 1, wherein the programmable addressable test chip is configured to test at least one of a device of the target chip or a device of the DUT array, and wherein the DUT array is disposed in the scribe lines.

9. The programmable addressable test chip of claim 8, wherein the programmable addressable test chip is configured to test transistors having threshold voltages and leakage currents under a saturation condition or a linear operating condition measured by the addressing circuits; whether two transistors match with each other is determined through a comparison between the threshold voltages of the two transistors and whether there are any problems in fabricating the transistors' electrodes is determined through corresponding leakage current data.

10. The programmable addressable test chip of claim 8, wherein the programmable addressable test chip is configured to test ring oscillators having a working frequency, dynamic currents, and quiescent currents measured by the addressing circuits; wherein based on the measurement, a delay of an inverter or logic gate in a ring oscillator is determined; wherein based on a correlation between the dynamic currents, the quiescent currents and frequency data, a dynamic power consumption and a quiescent power consumption of the inverter or logic gate the a ring oscillator is determined, such that characteristics of ring oscillators are determined and manufacturing process is monitored.

11. The programmable addressable test chip of claim 8, wherein the device of the target chip comprises one or more sections of a conductor of the target chip configured to be connected with the addressing circuits to test a resistance.

12. The programmable addressable test chip of claim 11, wherein the conductor comprises one or more wires of the target chip connected with the addressing circuits, and wherein a test result is configured for determining whether the one or more wires have a short circuit or a broken circuit problem.

13. A method of chip fabrication, the method comprising:
providing a target chip to be tested;
providing addressing circuits placed in scribe lines of a wafer reserved for cutting a plurality of target chips from the wafer;
fabricating a connecting circuit connecting the target chip and the addressing circuits on demand;
providing a device under test (DUT) array and a connection between the DUT array and the addressing circuits; and
cutting the connection upon a need arises for testing the target chip and fabricating the connecting circuit connecting the target chip and the addressing circuits.

14. The method of claim 13, further comprising providing components and pads fabricated in the scribe of the wafer during a process of fabricating test chips.

15. The method of claim 13, wherein the connecting circuit comprises one or more conductor wires fabricated using at least one of: a single metal layer, multiple metal layers, a single poly-silicon layer, multiple poly-silicon layers, a single package layer, or multiple package layers, through lithography.

16. The method of claim 13, wherein said fabricating a connecting circuit connecting the target chip and the addressing circuits on demand comprises direct electron beam writing.

17. The method of claim 13, wherein said fabricating a connecting circuit connecting the target chip and the addressing circuits on demand comprises metal deposition with a focused ion beam.

18. The method of claim 13, wherein said cutting comprises cutting by a focused ion beam, the method further comprising determining whether to fabricate the connecting circuit connecting the target chip and the addressing circuits based on characteristics and yield of product chips.

* * * * *